US006466019B2

United States Patent
Marek (10) Patent No.: US 6,466,019 B2
(45) Date of Patent: *Oct. 15, 2002

(54) COOLED NMR PROBE HEAD COMPRISING A DEVICE FOR CENTERING THE SAMPLE

(75) Inventor: Daniel Marek, Moeriken (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

This patent is subject to a terminal disclaimer.

(21) Appl. No.: 09/765,278

(22) Filed: Jan. 22, 2001

(65) Prior Publication Data

US 2001/0020848 A1 Sep. 13, 2001

(30) Foreign Application Priority Data

Feb. 12, 2000 (DE) .......................................... 100 06 324

(51) Int. Cl.[7] .................................................. G01V 3/00
(52) U.S. Cl. ........................ 324/318; 324/320; 324/322
(58) Field of Search ................................ 324/321, 300, 324/307, 309, 314, 315, 318, 322, 248, 320; 505/845

(56) References Cited

U.S. PATENT DOCUMENTS

| 3,525,928 A | | 8/1970 | Kunihiko | |
| 4,052,661 A | * | 10/1977 | Higham et al. | ............. 324/322 |
| 5,247,256 A | | 9/1993 | Marek | |
| 5,545,998 A | * | 8/1996 | Favre et al. | ................ 324/321 |
| 5,689,187 A | | 11/1997 | Marek | |
| 5,814,992 A | * | 9/1998 | Busse-Grawitz et al. | ... 324/318 |
| 5,889,456 A | * | 3/1999 | Triebe et al. | ............... 324/318 |
| 6,198,281 B1 | * | 3/2001 | Wand et al. | ................ 324/200 |

* cited by examiner

Primary Examiner—Edward Lefkowitz
Assistant Examiner—Dixomara Vargas
(74) Attorney, Agent, or Firm—Paul Vincent (57) ABSTRACT

An NMR (=nuclear magnetic resonance) probe head comprising an RF (=radio frequency) receiver coil system, which can be cooled down to cryogenic temperatures, and a room temperature pipe (5), extending in a z direction, for receiving a sample tube (6) containing sample substance to be examined by NMR measurements is characterized by a centering device (10) for centering the sample tube (6) in its measuring position about the axis of the room temperature pipe (5) to thereby provide simple and substantial reduction in the temperature gradient in the z direction during operation without thereby impairing the NMR measurement.

40 Claims, 6 Drawing Sheets

COOLED NMR PROBE HEAD COMPRISING A DEVICE FOR CENTERING THE SAMPLE

This application claims Paris Convention priority of DE 100 06 324.1 filed Feb. 12, 2000 the complete disclosure of which is hereby incorporated by reference.

BACKGROUND OF THE INVENTION

The invention concerns an NMR (=nuclear magnetic resonance) probe head comprising an RF (=radio frequency) receiver coil system, which can be cooled down to cryogenic temperatures, and a room temperature pipe extending in a z direction for receiving a sample tube containing a sample substance to be examined through NMR measurements.

A cooled NMR probe head of this type is e.g. known from U.S. Pat. No. 5,247,256.

The probe head is installed in a magnet, for generating a highly homogeneous static $B_0$ field, and comprises RF receiver coils disposed about a z axis which are cooled down during operation to temperatures of approximately 10 to 25 K by means of suitable heat exchangers and heat conducting elements to improve the signal-to-noise-ratio of the received NMR signal during the measurement. The RF receiver coils are in an evacuated region for heat insulation reasons which is formed essentially by a usually metallic casing of the probe head which is penetrated by a room temperature pipe disposed cylindrically about the z axis for receiving a sample tube. To permit passage of the RF signals from the sample to the RF receiver coils, the otherwise metallic room temperature pipe is replaced in the axial region of the coils by an RF permeable inner pipe, in most cases a glass pipe, which is connected to the metallic parts of the room temperature pipe in a vacuum-tight fashion.

After insertion of the sample tube into the room temperature pipe from the bottom, it is substantially maintained at a desired temperature (usually approximately 300K) using warm air flowing from below through the room temperature pipe to control the temperature of the sample substance. This, however, causes the associated problem that the measuring sample "feels" the considerably cooler surroundings of the NMR resonator, cooled down to 10 to 25 K, and radially radiates heat in this direction. This lost heat must be continuously replenished by the surging warm tempering air flow to ensure that the measuring sample remains essentially at the desired temperature. In consequence, an axial and radial temperature gradient is produced in the measuring sample which strongly impairs the NMR measurement. It is therefore the underlying purpose of the present invention to provide a cooled NMR probe head comprising the above-mentioned features wherein the temperature gradients occurring during operation are considerably reduced with as simple as possible technical means and without thereby impairing the NMR measurement.

SUMMARY OF THE INVENTION

This object is achieved in accordance with the present invention in a both surprisingly simple and effective manner by providing a centering device for centering the sample tube in its measuring position about the axis of the room temperature pipe.

In addition to exchangeable sample tubes, the NMR probe heads in accordance with the invention also include so-called flow-through heads wherein the sample tube remains fixedly installed and the fluid to be examined is introduced through a thin conduit on the one side (bottom) and is guided out on the other side (top). Probe heads of this type may be used in continuous passage and also in a flow and stop mode (for an extended measuring period). These probe heads are used for rapid introduction of the sample as well as for an important analysis step following a liquid chromatography separating cell. The former are called flow-through probe heads, the latter LC-NMR coupling. Probe heads of this type are also referred to as LC heads (liquid chromatography, in particular also HPLC High Pressure Liquid Chromatography). Probe heads of this type can particularly profit from cryotechnology and also from the modifications in accordance with the invention. The transverse temperature gradients, extending radially with respect to the z axis, which can occur during operation of a cooled NMR probe head and which are substantially responsible for the instabilities in the spectrum and also in the lock system result from integration of the local axial temperature gradients along the z direction, from the bottom of the sample to the observed point. The local axial temperature gradients are given by the product of the heat loss per unit surface and the local reciprocal value of the mass flow of tempering gas. This mass flow distribution depends on the asymmetry and the angular deviation of the axis of the sample tube from the z axis of the temperature pipe. Since this asymmetry appears as a factor in the overall product, even small axial displacements or inclinations of the measuring sample within the room temperature pipe have a large influence on the tempering flow. Therefore, the proposed centering device can have a considerable effect with regard to a reduction in the temperature gradients in the xy plane and an improvement of the quality of the NMR signals in the cooled probe head.

In a further development which is particularly easy to realize, the centering device comprises one or more spacers disposed between the room temperature pipe and the sample tube and symmetrically distributed about the z axis of the room temperature pipe.

These spacers may be disposed in the area of the bottom of the sample tube in its measuring position and/or in the area of the feed opening of the room temperature pipe on the side of the room temperature pipe facing the sample tube.

Alternatively, the spacers may extend over the entire axial length of the RF receiver coil system thus effecting as precise a centering of the sample tube as possible in the room temperature pipe.

In advantageous embodiments of the NMR probe head in accordance with the invention, several, preferably between 3 and 8, in particular 6 spacers are symmetrically distributed about the z axis of the room temperature pipe. This configuration has given the best results to date.

One further development is also advantageous, wherein the spacers consist of strips of elastic material extending in the direction of the z axis which are rigidly connected to the room temperature pipe at their ends facing away from the sample glass in its measuring position and whose ends facing the sample glass in its measuring position have a bead which is bulged towards the sample glass and whose free leg seats on the room temperature pipe. The centering device of this embodiment is particularly simple and inexpensive to produce and can be easily retrofitted in existing NMR probe heads.

To prevent disturbance of the NMR measurements, the spacers should be produced from a material which is transparent to RF radiation and possibly also magnetically compensated.

In a preferred further development, the spacers consist of sheet metal strips having a thickness of approximately 100 $\mu$m and a width transverse to the z axis of approximately 0.5 mm to 2 mm, preferably approximately 1 mm.

A particularly preferred embodiment of the NMR probe head in accordance with the invention provides for radiation shields disposed between the RF receiver coil system and the room temperature pipe which surround the room temperature pipe in a radial direction, extend in the z direction and are made of one or more materials oriented in the z direction which are almost completely transparent to RF fields or at least have an absorption of <5%, preferably <1% for RF fields.

Although cryotechnology has used radiation shields for some time to curtail heat radiation losses, this procedure is not directly applicable for a cooled NMR probe head since the normally metallic radiation shields, which reflect heat radiation, either completely block or at least strongly impair propagation of RF fields from the measuring sample to the RF receiver coils such that the incoming NMR signals are at least highly attenuated, distorted or completely unusable.

In accordance with the inventive solution, the radiation shields provided in the vacuum between the RF coils and the room temperature pipe solely comprise materials which are oriented in the z direction. The axial orientation of the radiation shield material prevents their finite susceptibility from impairing the resolution of the NMR signals. On the other hand, the physical properties of the materials should be such as to effect as large a transparency as possible in the region of radio frequency radiation. In most cases, this material property has the associated disadvantage that reflection of lost heat back towards the measuring sample is not very high.

It is advantageous if the radiation shields have at least a minimum separation from one another in the radial direction and do not contact each other or at the most contact at points or linearly to prevent direct heat conduction between the individual radiation shields in a radial direction which would lead to a thermal "short circuiting". Occasional contact between the radiation shields is not a serious problem, in particular if the chosen material has very low heat conduction. As long as the individual contacting points or lines are sufficiently spaced apart from one another, the overall heat conduction between the radially disposed radiation shields can be essentially neglected for the purposes of the invention.

One further development is particularly preferred, wherein the radiation shields are constructed from a material which reflects or at least absorbs radiation in a wavelength range of 10 $\mu$m$\leq\lambda\leq$100 $\mu$m and which is transparent to radiation in a wavelength range of $\lambda$>100 mm. The former wavelength range corresponds to heat radiation at a temperature of between approximately 20K to 300K which corresponds to the temperature difference between the measuring sample and the cooled NMR coils. The latter wavelength range corresponds to radiation of a frequency above 3 GHz, wherein the RF range which is important for NMR measurements is between several MHz and below approximately 1 GHz.

An optimum material which has practically no absorption losses in the considered RF range, and on the other hand is not transparent in the above-mentioned heat radiation range, is e.g. glass or quartz.

The radiation shields of the NMR probe head in accordance with the invention could theoretically be configured as tubes coaxially surrounding the room temperature pipe, however, the thickness of the tube material would normally be too large.

The radiation shields could also be constructed from a unidirectional foil whose production and processing is, however, relatively difficult. Orientation of the foil along the z axis can be realized e.g. through application of mechanical tensile stress. In contrast thereto, one embodiment is preferred, in which the radiation shields are made from a unidirectional fabric. Unidirectional fabric of this type having correspondingly suitable materials is commercially available.

These fabrics preferably consist of fiber mats, in particular fiber glass mats which are made of fibers having a diameter of less than 10 $\mu$m and a total thickness of approximately 30 $\mu$m. When using such fiber glass mats, it would be feasible to wind them in several layer in a spiralling fashion about the room temperature pipe on its vacuum side instead of providing a radial sequence of individual cylindrical radiation shields.

In a further particularly preferred embodiment, the radiation shields are formed of rods or fibers, preferably glass fibers and/or quartz fibers oriented in the z direction and radially disposed about the axis of the room temperature pipe. Fibers of this type are available with diameters of between 10 and 50 $\mu$m. Although, glass filaments having a diameter of less than 5 $\mu$m are also available, these would probably be difficult to work with.

In a preferred further development, the radiation shields are formed of fiber bundles having somewhat higher overall mechanical stability than the individual filaments and are thus easier to work, similar to rods.

In embodiments of the invention, the rods or fibers may be disposed freely in space and be fastened only at their ends.

Alternatively, the rods or fibers may be mounted to a support pipe disposed coaxially with respect to the room temperature pipe, preferably on the side of the room temperature pipe facing the RF receiver coil system.

In a preferred further development the rods or fibers are mounted to the support pipe or room temperature pipe using a glue transparent to RF radiation in order to prevent attenuation of the RF radiation from the measuring sample to the RF receiver coil due to gluing.

One further development is also advantageous, wherein the rods or fibers are densely packed in the peripheral direction about the axis of the room temperature pipe to prevent "visible gaps" as viewed in the radial direction. In this fashion, the rods or fibers each form a radiation shield connected in the peripheral direction.

One embodiment of the NMR probe head in accordance with the invention is particularly preferred in which a tempering means is disposed between the RF receiver coil system and the sample tube, extending in the z direction, surrounding the sample tube in the radial direction, and preferably formed from a material having high thermal conductivity which is almost completely transparent to RF fields or at least has an absorption of <5%, preferably <1% for RF fields.

This prevents dissipation of heat from the measuring sample and thus uneven cooling without significantly impairing the received NMR signals. The advantage of such a tempering means compared to a heated air flow about the sample tube is mainly the fact that the thermal efficiency can act uniformly through the entire axial length of the sample tube. The central area is thus as well tempered as the edge areas thereby effectively preventing axial temperature gradients. In contrast thereto, a conventionally heated air flow, without the heating means in accordance with the invention, usually enters into the room temperature pipe at the lower end of the sample tube, starts to heat up the sample tube at this location, and continues to cool down while rising in the axial direction. The temperature of the heated air flow in the upper region of the sample tube will therefore always be less than in the lower area thereby inevitably reducing the tempering performance in the upper region of the sample tube. As a result, there will always be an axial temperature gradient which can be somewhat reduced by increasing the amount of air per unit time, however cannot be prevented in principle. Moreover, the corresponding countermeasures are highly limited since, if the amount of air per unit time is too large, vibration free positioning or proper rotation of the sample tube can no longer be guaranteed.

In a possible further development of this embodiment, the tempering means comprises a layer having a radial thickness of <1 mm, preferably <50 $\mu$m, radially surrounding the sample tube in the axial region of the RF receiver coil system and formed of a material which at least partially absorbs radiation in a wavelength range of 100 nm$\leq\lambda\leq$100$\mu$m and which is transparent to radiation in a wavelength range of $\lambda$>100 mm.

For uniform heating of the layer, the NMR probe head in accordance with the invention is preferably provided with a heating means.

In a preferred further development, the heating means comprises a device for irradiating the layer with radiation in a wavelength range of 100 nm$\leq\lambda\leq$100 $\mu$m, in particular with heat radiation, the device being preferably disposed on the side of the room temperature pipe facing the RF receiver coil system.

Many materials which can be used to construct the room temperature pipe already absorb in the desired wavelength range such that heating up using radiation does not require a special radiation-absorbing layer.

The radiation absorbing heating layer may surround the room temperature pipe over a large area. Alternatively, the layer may be disposed about the room temperature pipe in axially extending strips disposed at a separation from one another in the peripheral direction.

One further development is particularly preferred in which the layer is electrically conducting and can be heated through application of an electric voltage.

Alternatively or additionally, a further embodiment provides that the tempering means comprises one or more heating coils of thin, in particular layered, electrically good conducting material each comprising an outgoing and return conductor. The outgoing and return conductors of the heating coils are electrically connected to one another at one end and can be supplied with heating current from a current source at the other end.

In a particularly preferred manner, the outgoing and return conductors of the heating coils are disposed bifilarly at as small a separation from one another as possible to minimize generation of a disturbing magnetic field during current flow.

In this connection, it is advantageous if the outgoing and return conductors of the heating coils consist of two longitudinal strips disposed one on top of the other which are electrically insulated from one another by an insulation layer or insulation strip.

A further development is particularly preferred with which the outgoing and return conductors of the heating coils are made from materials having different magnetic susceptibilities and which are selected such that each overall heating coil is magnetically compensated towards the outside.

The tempering means can be geometrically designed such that one or more heating coils are disposed in a spiral fashion about the room temperature pipe.

As an alternative, it is also possible to dispose several, preferably at least 8, heating coils at a separation from one another in the peripheral direction about the z axis of the room temperature pipe, which extend parallel to the z direction.

Advantageously, the heating coils are spatially oriented such that they are minimally coupled to the RF receiver coil system.

One embodiment of the heating coils having a material exhibiting as good an electrical conductance as possible (e.g. Cu) is particularly preferred, wherein the conductors have rectangular, possibly square or circular cross-sections (typically of a magnitude of 10 $\mu$m×10 $\mu$m or less). Due to the resulting very small overall surface covering, the room temperature pipe maintains its good permeability to RF fields, and the RF losses are also very low due to both the small surfaces of the heating conductors and the good electrical (and thus RF) conductivity.

In a preferred further development of the above-described embodiment, a low-pass filter may be provided between the current source and the heating coils to minimize signal distortion and residual attenuation.

One further development is also preferred in which a parallel resonant circuit is provided between the current source and the heating coils whose resonance frequency is the most sensitive RF frequency relevant for NMR measurements. Such a rejector circuit also prevents transmission of disturbing signals to the RF receiver coil system and minimizes unwanted coupling out of the RF signals via the heating coils.

In a further development, the current source advantageously supplies the heating coils with alternating current in order to keep further disturbances in the static magnetic field as small as possible. The angular frequency is thereby selected such that generated side bands are all outside of the observed NMR spectral window.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 1b shows a horizontal section through an arrangement in accordance with FIG. 1a;

FIG. 3b shows the temperature distribution in the z direction associated with the arrangement according to FIG. 3a;

FIG. 4b shows the associated temperature dependences in the direction of the z axis on the left and right-hand side of the arrangement of FIG. 4a;

DESCRIPTION OF THE PREFERRED EMBODIMENT

Figure 1A:
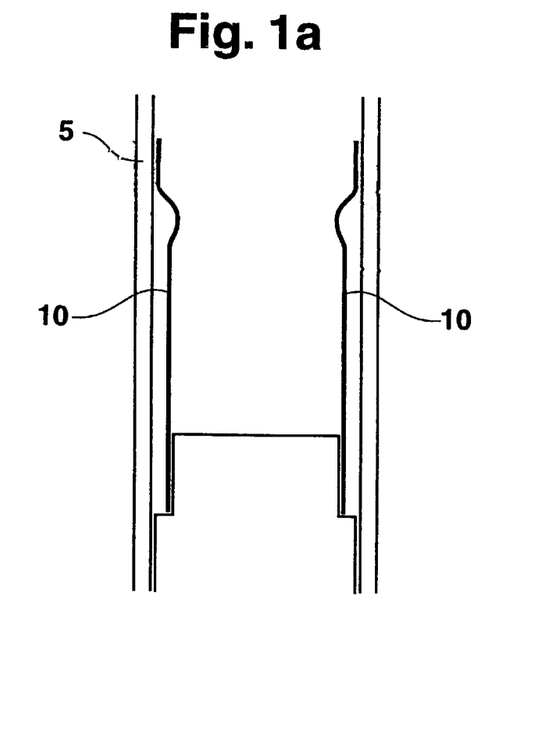
FIG. 1a shows a schematic vertical section through an arrangement in accordance with the invention comprising a centering device.
Figure 1B:
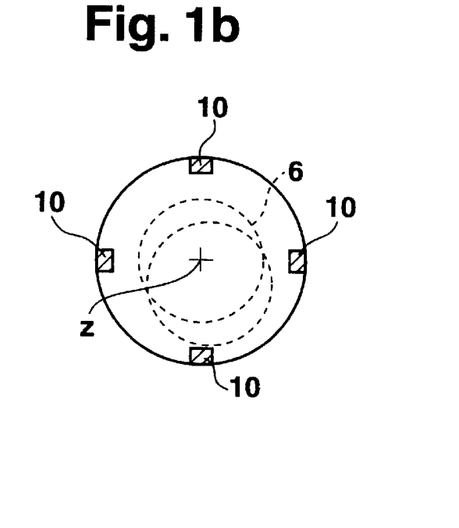
Figure 1C:
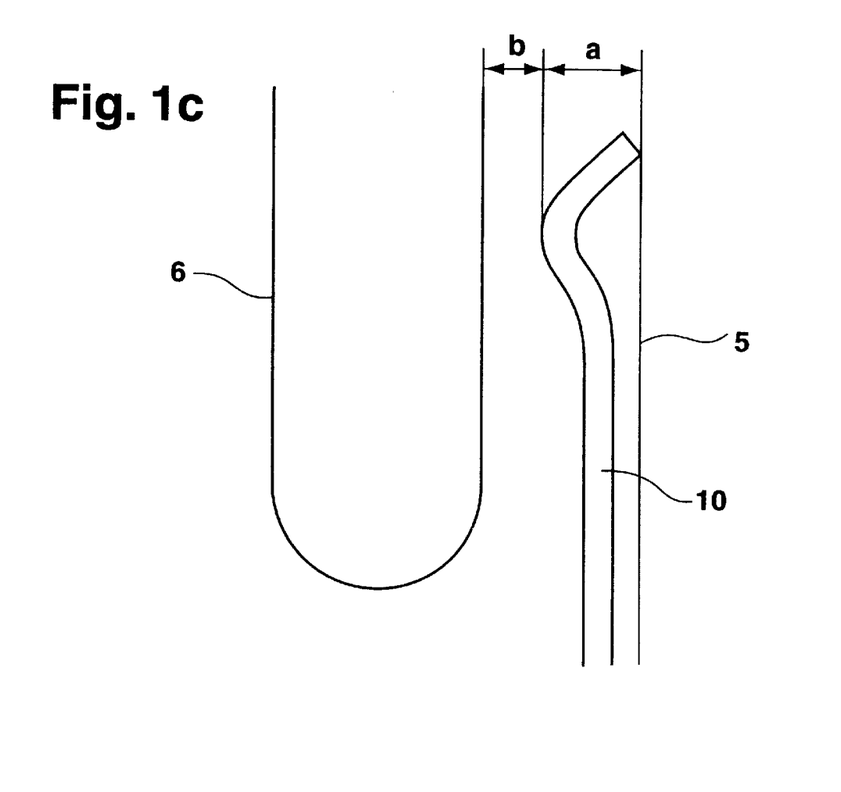
FIG. 1c shows an enlarged detailed illustration of the arrangement in accordance with FIG. 1a comprising a sample tube in its measuring position.

FIGS. 1a through 1c show a preferred embodiment of the inventive NMR probe head comprising a centering device having four spacers 10 symmetrically disposed about the z axis. The effected accurate centering of the sample tube 6 within the room temperature pipe 4 helps to prevent convection flow and thus formation of temperature gradients within the sample substance 7.

In the currently available NMR probe heads, the inside diameter of the room temperature pipe 4 in the area of the inner pipe 5 is approximately 5.6 mm and most sample tubes 6 have an outer diameter of 5.0 mm. This results in an average distance of a+b=0.33 mm from the outer wall of the sample tube 6 to the inner wall of the inner tube 5. In FIG. 1c this gap is bridged in a defined manner with respect to the path "a", by the inventive spacer 10. The remaining distance b is maintained for easy insertion and substantially contact-free rotation of the sample tube 6 in the room temperature tube 4, wherein a should be on the order of 0.2 mm and b approximately 0.1 mm. These values already provide considerable improvement with regard to the radial temperature gradients.

Figure 7A:
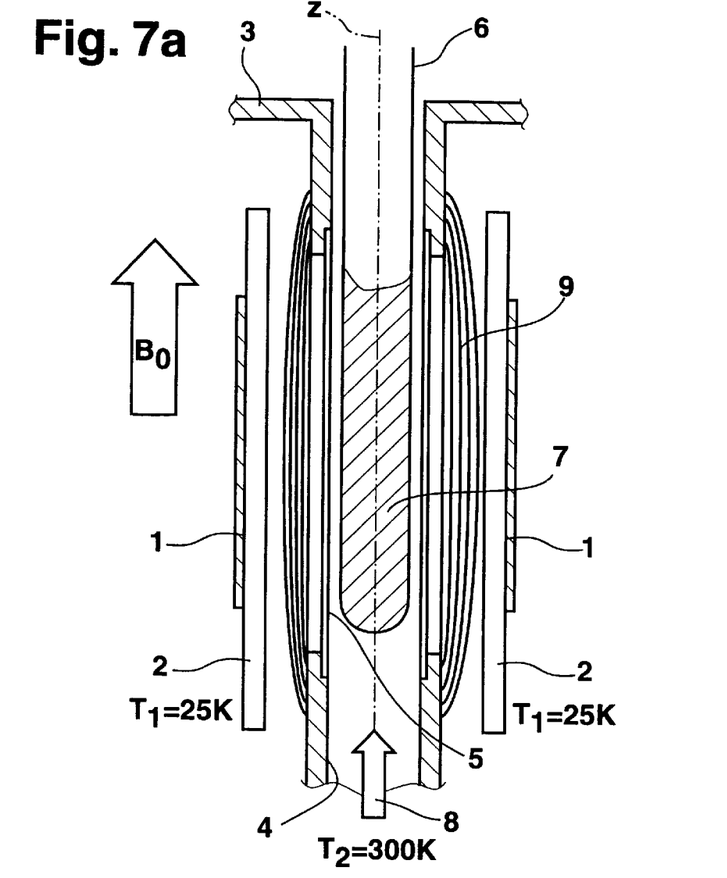
FIG. 7a shows a schematic vertical section through an inventive NMR probe head with heat shields between the room temperature pipe and RF receiver coil system.

FIG. 7a, which is described, below shows further details of the construction of an NMR probe head in accordance with the invention.

Figure 2:
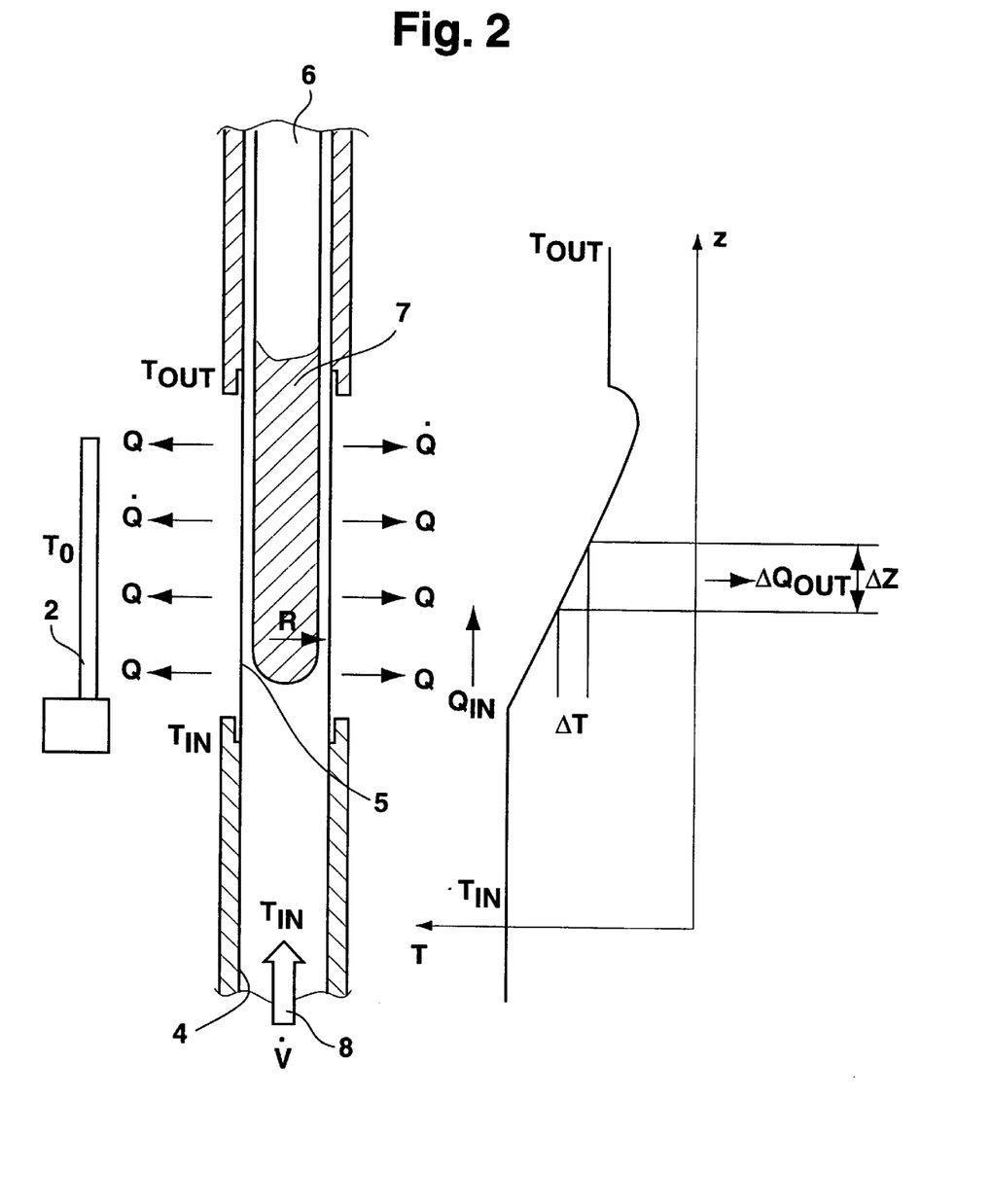
FIG. 2 shows a schematic vertical section through a cooled prior art NMR probe head with associated temperature dependence in the direction of the z axis.

The operation of the inventive arrangement is explained below:

FIG. 2 schematically shows a section of an NMR probe head of prior art, wherein radiative heat flow Q passes from a sample tube 6 in a radial direction towards the RF receiver coil system 1 since the receiver coil system 1 is maintained at a cryogenic temperature of approximately 25K while the sample tube 6 should be held approximately at room temperature using the tempered air flow 8 supplied from below. The heat radiation from the sample tube 6 results, taking into consideration the heat supplied by the tempering flow 8, in a temperature dependence in an axial direction within the sample tube 6 as schematically shown at the right hand side of FIG. 2.

The relatively high temperature gradients within the sample substance 7 often result in an undesired deterioration of the recorded NMR spectra. The lines widen due to the temperature dependence of the chemical shift which can prevent simultaneous shimming of two substances. This effect is particularly distinct with water.

In addition, convection effects may occur if the temperature gradient has exceeded a critical value. The resulting fluctuations can considerably impair stability during shimming and during NMR experiments.

Figure 3A:
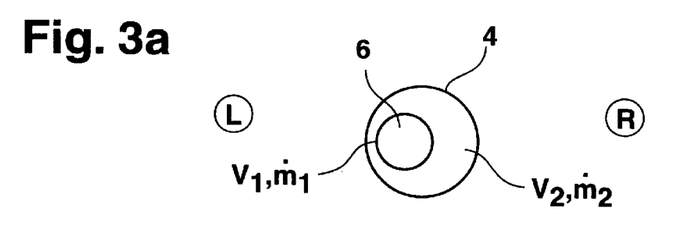
FIG. 3a shows a schematic horizontal section through an arrangement comprising a sample tube introduced asymmetrically into the room temperature pipe.

In addition to the temperature gradients in the z direction, transverse gradients can also occur if the sample tube 6 is not positioned exactly in the center of the room temperature pipe 4, as schematically shown in the horizontal section of FIG. 3a.

Figure 3B:
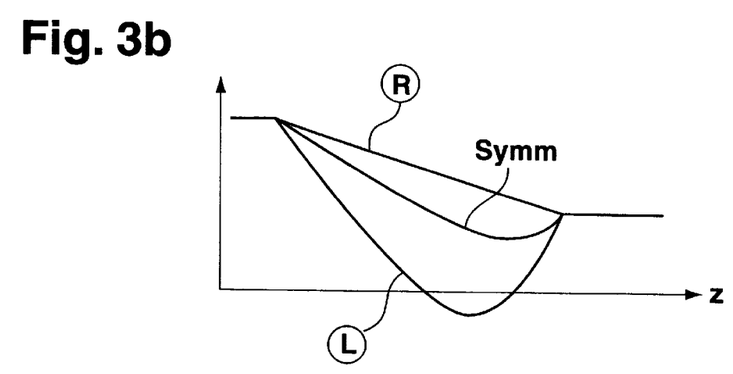

Due to the differing mass flow resulting from the differing flow resistances on the left (L) and right (R) sides, differing longitudinal gradients occur on either side, leading to a transverse temperature gradient which becomes more distinct towards the top, as shown in FIG. 3b. Of the three temperature dependences shown, the middle one illustrates the symmetric case.

Figure 4A:
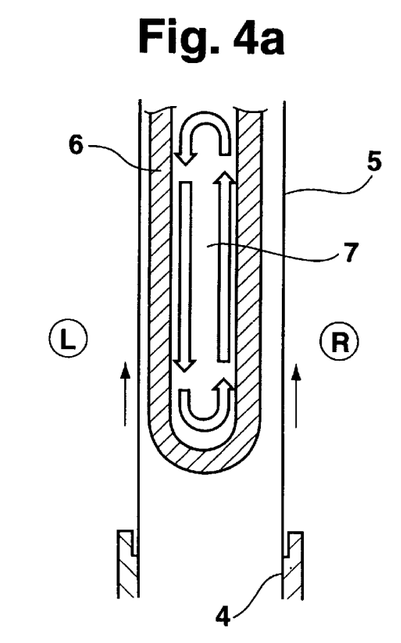
FIG. 4a shows a schematic vertical section through a room temperature pipe with asymmetrically introduced sample tube and indicated convection flows within the measuring sample.
Figure 4B:
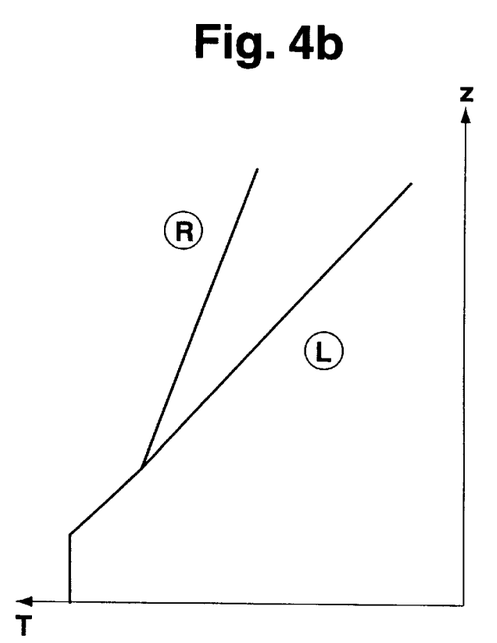

This gradient additionally promotes formation of convection within the normally liquid sample substance 7, as is schematically shown in FIG. 4a. The associated temperature dependences in the z direction are shown in FIG. 4b. The temperature dependence on the right-hand side (=R) may thereby considerably differ from the temperature dependence on the left-hand side (=L).

To counteract this effect, the central part 5 of the room temperature pipe 4 is made from a material having good heat conduction to thereby considerably reduce the transverse temperature gradients (x-y direction). However, only those materials are acceptable having negligibly small RF radiation absorption while also exhibiting the required high heat conductivity. A concrete example is sapphire.

Figure 5:
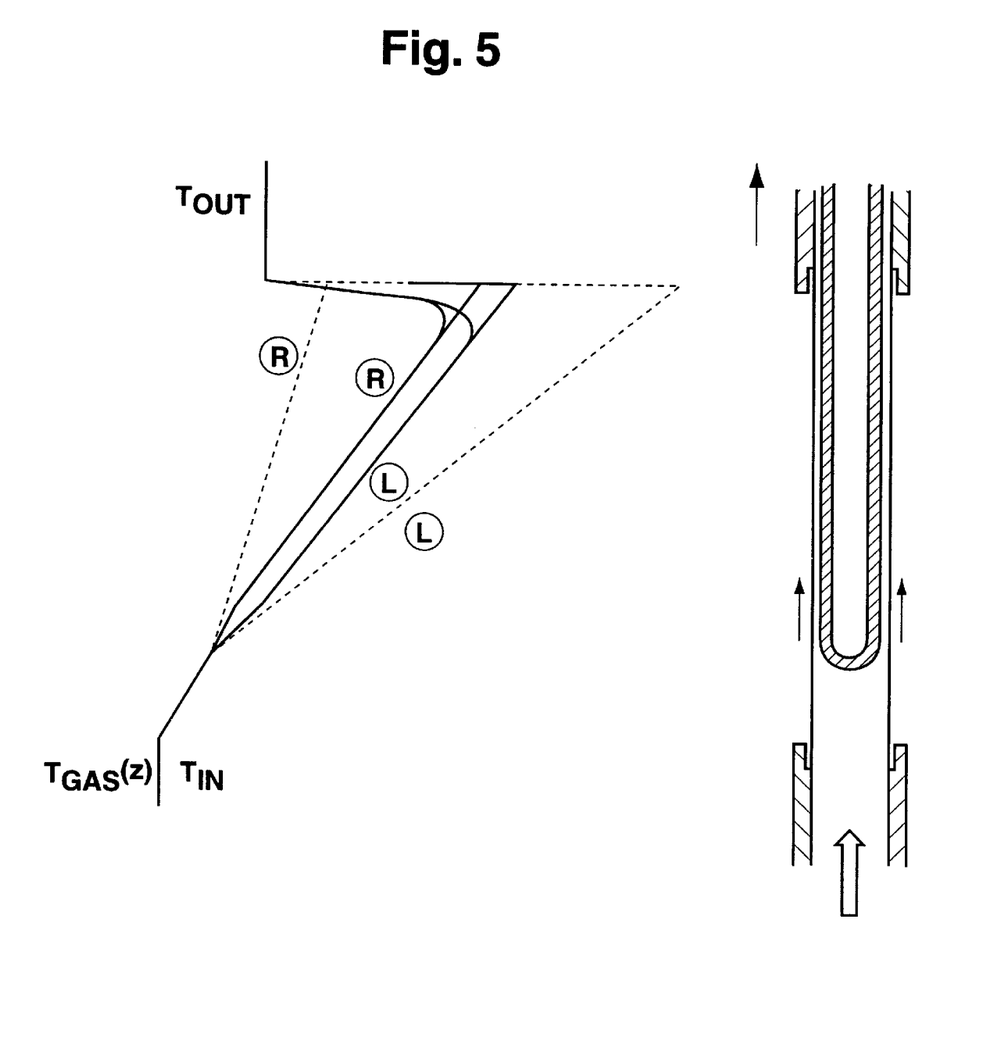
FIG. 5 shows a schematic temperature dependence of the tempering gas in the direction of the z axis with the sample tube being introduced asymmetrically into the room temperature pipe, with the inner side of the room temperature pipe in the region of the RF receiver coils having good heat-conducting properties.

FIG. 5 shows this situation with poor heat conductivity (broken lines) and with good heat conductivity (solid lines) for the room temperature pipe 4, in particular of the inner pipe 5. The temperature dependence along the z axis cannot be substantially influenced thereby (except for averaging of the two extrema). Only the temperature dependence directly before the upper clamping point of the sample tube 6 can be improved. It is not possible to eliminate a linear temperature gradient merely through heat-conducting measures on the room temperature pipe 4.

Figure 6:
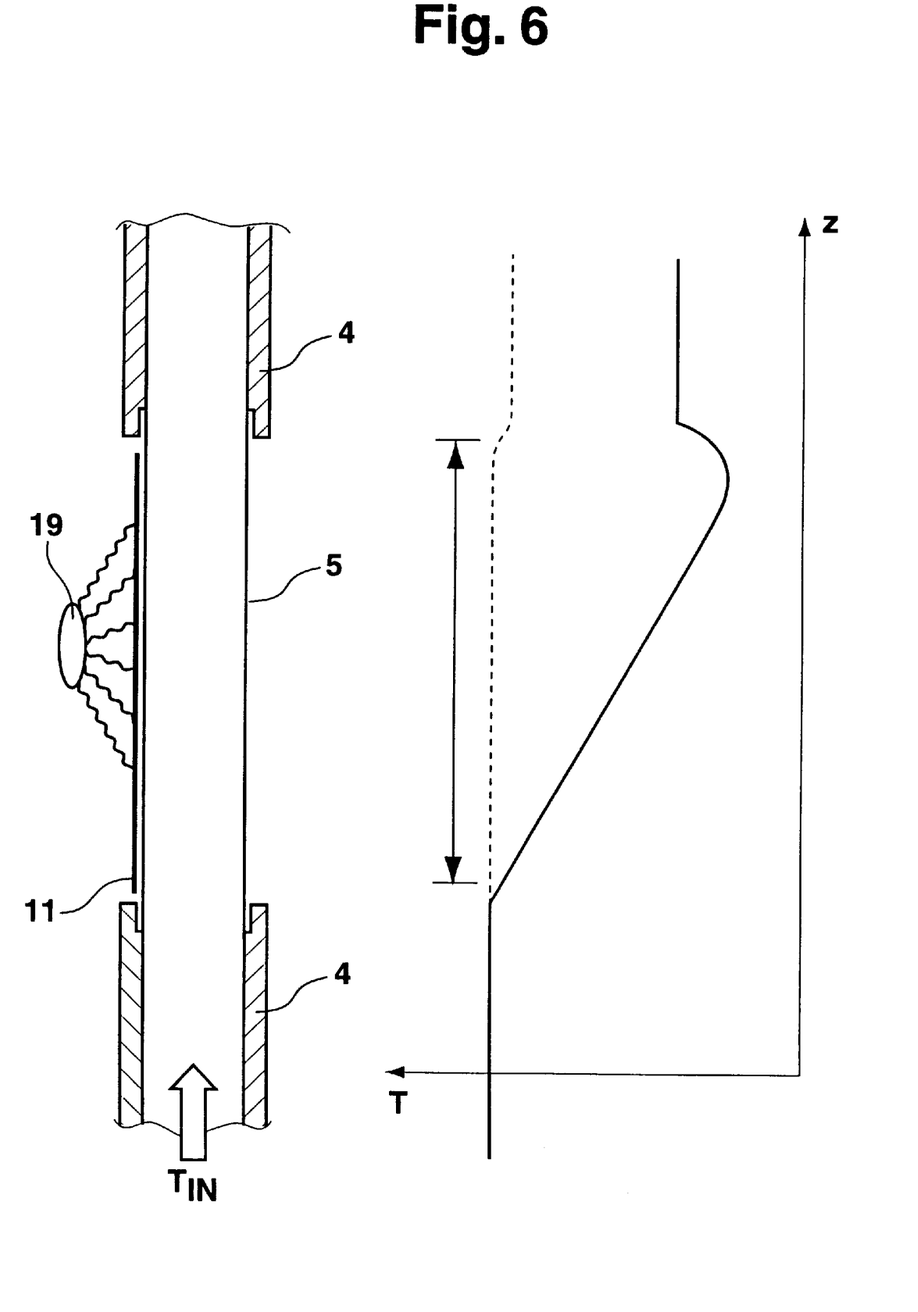
FIG. 6 shows a schematic vertical section through an inventive arrangement comprising tempering means and associated temperature dependence along the z axis.

FIG. 6 is a schematic vertical cross-section of an NMR probe head in accordance with the invention comprising a tempering means 11 in the axial area of the inner pipe 5 of a room temperature pipe 4 and the associated temperature dependence along the z axis. The tempering means 11 can be realized e.g. by electric heating and/or radiation heating of a corresponding surface on the room temperature pipe 4 in the region of the inner pipe 5 by means of a heating means 19. The temperature dependence along the z axis on the right-hand side of the drawing shows, in solid lines, the situation without tempering means and, in broken lines, the situation with a regulated tempering means showing an almost constant temperature along the entire z axis.

The embodiment of the NMR probe head in accordance with the invention schematically shown in FIG. 7a comprises an RF receiver coil system 1 which is disposed symmetrically, with respect to a z axis, about an axially extending room temperature pipe 4 which serves for accommodating a sample tube 6 containing a sample substance 7 to be examined by NMR measurements.

The RF receiver coil system 1 is mounted onto heat conducting elements 2 which cool the RF receiver coil system 1 to cryogenic temperatures, usually $T_1 \approx 25K$.

The upper and lower sections of the room temperature pipe 4 are connected to a casing 3 of the NMR probe head whereas its central section comprises an inner pipe 5 (mainly of glass) which is permeable to RF fields. The sample tube 6, axially projecting into the room temperature pipe 4, is held at the desired temperature during the measurements by means of a gas flow 8 which is tempered approximately to room temperature $T_2 \approx 300K$.

Figure 7B:
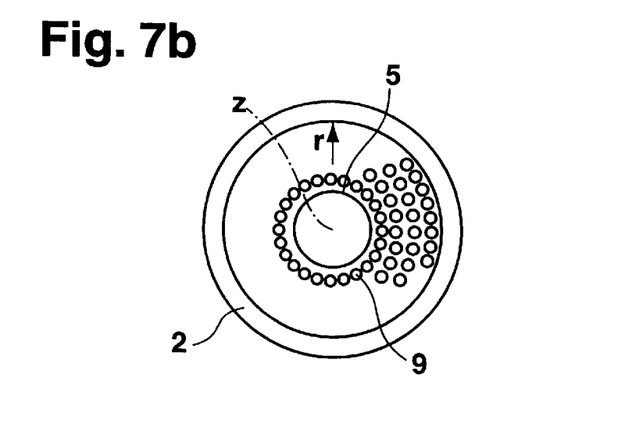
FIG. 7b shows a schematic horizontal section through an arrangement in accordance with FIG. 7a in the axial area of the RF receiver coil system.

FIGS. 7a and 7b clearly show that several radiation shields 9 are disposed between the receiver coil system 1 and the room temperature pipe 4 surrounding the room temperature pipe 4 in a radial direction and extending along the z axis. The radiation shields 9 are formed of materials oriented in the z direction which are almost completely transparent to RF fields. The radiation shields 9 are separated from each other in the radial direction and do not contact another or, at the most, have point or linear contacts, as clearly shown in FIG. 7b. They have a radial thickness <0.1 mm, preferably <50 μm. The radiation shields 9 are preferably made from glass or quartz.

To obtain orientation of the material in the z direction as required by the invention, the radiation shields 9 may be formed of a unidirectional foil, of unidirectional fabric, in particular of fiber glass mats, or of axially extending rods or fibers, preferably glass or quartz fibers or fiber bundles.

The radiation shields 9 may be freely disposed in space and mounted only at their ends or, as shown in the embodiment, mounted to the room temperature pipe 4.

For reasons of clarity, FIGS. 6, 7a and 7b do not show the centering device in accordance with the invention. It can be incorporated as any of the embodiments described above.

I claim:

1. An NMR (nuclear magnetic resonance) probe head for examining a sample substance in a sample tube, the probe head comprising:
   an RF receiver coil system;
   means for cooling said receiver coil system to cryogenic temperatures;
   a room temperature pipe extending along a z-axis, said room temperature pipe for receiving the sample tube; and
   a centering device disposed for centering the sample tube, in its measuring position, about an axis of the room temperature pipe.

2. The NMR probe head of claim 1, wherein said room temperature pipe is cylindrical.

3. The NMR probe head of claim 1, wherein said centering device comprises at least one spacer disposed between said room temperature pipe and the sample tube.

4. The NMR probe head of claim 3, wherein one of several, between 3 and 8, and 6 spacers are symmetrically distributed about the z-axis of said room temperature pipe.

5. The NMR probe head of claim 3, wherein said at least one spacer is disposed in a region of a bottom of the sample tube in its measuring position and on a side of said room temperature pipe facing the sample tube.

6. The NMR probe head of claim 3, wherein said at least one spacer is disposed about an entire axial length of said RF receiver coil system on a side of said room temperature pipe facing the sample tube.

7. The NMR probe head of claim 3, wherein said at least one spacer is disposed in a region of a feed opening of said room temperature pipe on a side of said room temperature pipe facing the sample tube.

8. The NMR probe head of claim 3, wherein said at least one spacer comprises strips of flexible material extending in a direction of the z-axis, whose ends, facing away from the sample tube in its measuring position, are rigidly connected to said room temperature pipe and whose ends, facing the sample tube in its measuring position, have a bead that bulges towards the sample tube, said bead having a free leg seating on said room temperature pipe.

9. The NMR probe head of claim 3, wherein said spacer comprises a material which is transparent to RF radiation.

10. The NMR probe head of claim 3, wherein said spacer comprises a magnetically compensated material.

11. The NMR probe head of claim 10, wherein said spacer comprises sheet metal strips having a thickness of approximately 100 μm and a width transverse to the z axis of one of approximately 0.5 mm to 2 mm, and approximately 1 mm.

12. The NMR probe head of claim 1, further comprising at least one radiation shield disposed between said RF receiver coil system and said room temperature pipe, said radiation shield extending in a z-direction and surrounding said room temperature pipe in a radial direction, said at least one radiation shield comprising at least one material oriented in the z-direction which is one of substantially transparent to RF fields, exhibits RF absorption of <5%, and exhibits RF absorption of <1%.

13. The NMR probe head of claim 12, wherein a plurality of radiation shields are spaced apart from one another in a radial direction, wherein said radiation shields are one of not in contact, in point contact, and in linear contact with another.

14. NMR probe head of claim 12, wherein said radiation shield comprises a material which one of absorbs and reflects radiation in a wavelength range of $10 \, \mu m \leq \lambda \leq 100 \, \mu m$ and which is transparent to radiation in a wavelength range of $\lambda > 100$ mm.

15. The NMR probe head of claim 14, wherein said radiation shield comprises glass or quartz.

16. The NMR probe head of claim 12, wherein said radiation shield comprises a unidirectional fabric.

17. The NMR probe head of claim 16, wherein said fabric comprises one of fiber mats and fiber glass mats.

18. The NMR probe head of claim 12, wherein said radiation shield comprises members which are oriented in a z-direction and disposed radially about an axis of said room temperature pipe, said members comprising at least one of rods, fibers, glass fibers, quartz fibers, and fiber bundles.

19. The NMR probe head of claim 18, wherein said members are freely disposed in space and are attached only at ends thereof.

20. The NMR probe head of claim 18, wherein said members are mounted on one of a support pipe disposed coaxially with respect to said room temperature pipe and on said room temperature pipe itself, on a side thereof facing said receiver coil system.

21. The NMR probe head of claim 18, wherein said members are densely packed in a peripheral direction about an axis of said room temperature pipe.

22. The NMR probe head of claim 1, further comprising a tempering means disposed between said receiver coil system and the sample tube, said tempering means radially surrounding the sample tube and extending in a z-direction.

23. The NMR probe head of claim 22, wherein said tempering means comprises a material having high thermal conductivity which is one of substantially transparent to RF fields, having an absorption for RF fields of <5%, and having an absorption for RF fields of <1%.

24. The NMR probe head of claim 22, wherein said tempering means comprises a layer radially surrounding the sample tube in an axial region of said receiver coil system, said layer having a radial thickness which is one of <1 mm and <50 $\mu$m, said layer comprising a material which at least partially absorbs radiation in a wavelength range of 100 nm$\leq\lambda\leq$100 $\mu$m and which is substantially transparent to radiation in a wavelength range of $\lambda$100 mm.

25. The NMR probe head of claim 24, further comprising a heating means for uniform heating of said layer.

26. The NMR probe head of claim 25, wherein said heating means comprises a device for irradiating said layer with one of radiation in a wavelength range of 100 nm$\leq\lambda\leq$100 $\mu$m and with heat radiation, wherein said heating means is disposed on a side of said room temperature pipe facing said receiver coil system.

27. The NMR probe head of claim 24, wherein said layer surrounds a surface of said room temperature pipe.

28. The NMR probe head of claim 24, wherein said layer is disposed about said room temperature pipe in axially extending strips which are separated from one another in a peripheral direction.

29. The NMR probe head of claim 24, wherein said layer can be electrically heated.

30. The NMR probe head of claim 22, wherein said tempering means comprises at least one heating coil, said heating coil comprising at least one of thin and layered material, having good electric conductance, wherein each of said at least one heating coil comprises an outgoing and return conductor, wherein said outgoing and return conductors are electrically connected to one another at one end and can be supplied with heating current from a current source at an other end.

31. The NMR probe head of claim 30, wherein said outgoing and return conductors are disposed bifilarly in close mutual proximity.

32. The NMR probe head of claim 31, wherein said outgoing and return conductors comprise two longitudinal strips disposed one on top of an other, which are electrically insulated from one another via an insulation layer or insulation strip.

33. The NMR probe head of claim 30, wherein said outgoing and return conductors comprise materials having different magnetic susceptibility, which are selected such that said heating coil is magnetically compensated towards an outside.

34. The NMR probe head of claim 30, wherein said at least one heating coil is disposed in a spiral fashion about said room temperature pipe.

35. The NMR probe head of claim 30, wherein one of several, and at least 8 heating coils are disposed at a separation from one another in a peripheral direction about a z-axis of said room temperature pipe and extending parallel to a z-direction.

36. The NMR probe head of claim 30, wherein said heating coil is spatially oriented for minimal coupling to said RF receiver coil system.

37. The NMR probe head of claim 30, wherein said heating coil comprises one of thin material exhibiting good electrical conductance, and thin material of good electrical conductance having a cross-section between 1 $\mu$m$^2$ and 100 $\mu$m$^2$.

38. The NMR probe head of claim 30, further comprising a low-pass filter circuited between said current source and said heating coil.

39. The NMR probe head of claim 30, further comprising a parallel resonant circuit disposed between said current source and said heating coil, said resonant circuit having a resonant frequency at a most sensitive RF frequency relevant for NMR measurements.

40. The NMR probe head of claim 30, wherein said current source generates an alternating current.

* * * * *